United States Patent [19]
Lee et al.

[11] Patent Number: 5,774,555
[45] Date of Patent: Jun. 30, 1998

[54] SWITCHED CAPACITOR BANDPASS FILTER FOR DETECTING PILOT SIGNAL

[75] Inventors: Jeoung-in Lee, Bucheon; Yank-gyun Kim, Seoul, both of Rep. of Korea

[73] Assignee: Samsung Electronics Co., Ltd., Rep. of Korea

[21] Appl. No.: 699,610

[22] Filed: Aug. 19, 1996

[30] Foreign Application Priority Data

Aug. 12, 1994 [KR] Rep. of Korea ................... 94-19947

[51] Int. Cl.$^6$ ............................................. H04H 5/00
[52] U.S. Cl. ........................................... 381/4; 381/12
[58] Field of Search ............................ 381/4, 7, 10, 13; 331/20, 25

[56] References Cited

U.S. PATENT DOCUMENTS 4,860,354  8/1989  Van Roermund ................. 381/10
4,932,058  6/1990  Marrah et al. .................... 381/7

*Primary Examiner*—Forester W. Isen
*Attorney, Agent, or Firm*—Cushman Darby & Cushman IP Group of Pillsbury Madison & Sutro LLP

[57] ABSTRACT

An apparatus for detecting a pilot signal. A phase detector detects a phase difference between a filtered amplitude-modulated pilot signal and a frequency divided signal, and a low pass filter low-pass-filters the phase difference. A voltage-controlled oscillator outputs a clock signal having a frequency determined by an output signal of the low-pass filter and outputs the clock signal having the frequency determined by an oscillation control signal. A (1/N) frequency divider divides the switching signal and outputs the (1/N) divided signal as a frequency divided signal, and an envelope detector detects an envelope of the filtered amplitude-modulated pilot signal and outputs the detected envelope as the pilot signal. The frequency of the pilot signal has information used to discriminate a broadcasting state. Therefore, the manufacturing cost and the number of pins in an integrated circuit can both be reduced.

7 Claims, 4 Drawing Sheets

SWITCHED CAPACITOR BANDPASS FILTER FOR DETECTING PILOT SIGNAL

BACKGROUND OF THE INVENTION

The present invention relates to a pilot signal, and more particularly, to an apparatus and a method therefor for detecting a pilot signal for discriminating a broadcasting state of a two-carrier multi-sound broadcast receiver, using a switched capacitor bandpass filter.

In a two-carrier multi-sound broadcasting, broadcasting-state discriminating signal, that is, a pilot signal, for indicating a broadcasting state (mono/stereo/bilingual), is loaded on a subcarrier. Therefore, a television or video tape recorder discriminates the broadcasting state by detecting the pilot signal. However, since the pilot signal is very small in magnitude, as compared with that of an adjacent sound signal, and is severely distorted due to noise and the sound signal, a bandpass filter having an extremely narrow band is required in order to detect the pilot signal.

Roughly, there are three available methods for implementing such a bandpass filter having an extremely narrow band.

First, an external filter could be used. Though this achieves the best results as far as electrical characteristics are concerned, the use of a filter in the form of a separately manufactured product is the most costly.

Alternatively, an operational transconductance amplifier (OTA) may be used. This method reduces the number of external components and the number of ports of an integrated circuit by incorporating an internal filter and results in a lower production cost. However, the pole of the OTA filter is determined by the absolute value of integrated capacitors and resistors. Therefore, when manufacturing the filter within the integrated circuit, without trimming the absolute value of internal components, the filter cannot have an accurate pole due to the effects of process parameters.

To solve this process parameter problem, a switched capacitor filter (SCF) is used. Using this method, the pole of the SCF is determined only by the ratio of capacitors and the frequency of a clock applied to drive a switch, regardless of the capacitors' absolute value. For this reason, even when the capacitance values vary with process parameters in manufacturing the filter within an integrated circuit, the ratio of the capacitors is scarcely varied, so that an accurate pole characteristic can be obtained. Unfortunately, however, the SCF needs an exact clock. The clock signal should be fed externally using an expensive component (e.g., a tuned crystal), as shown in FIG. 1 illustrating the configuration of a bandpass filter using the SCF and externally provided clock.

SUMMARY OF THE INVENTION

Therefore, in order to overcome such problems, it is an object of the present invention to provide an apparatus for detecting a pilot signal, using a switched capacitor bandpass filter.

It is another object of the present invention to provide an apparatus for detecting the pilot signal by adaptively changing an oscillation frequency of a voltage controlled oscillation frequency of a voltage controlled oscillator (VCO) so as to precisely control, without an external device, a center frequency of the switched capacitor bandpass filter.

It is yet another object of the present invention to provide a method for controlling the center frequency of the switched capacitor bandpass filter.

To accomplish the first object of the present invention, an apparatus for detecting a pilot signal is provided which includes a switched capacitor bandpass filter for receiving a composite signal of an audio signal and an amplitude-modulated pilot signal, filtering the amplitude-modulated pilot signal in response to a clock signal, and outputting the filtered amplitude-modulated pilot signal; a phase detector for detecting a phase difference between the filtered amplitude-modulated pilot signal and a frequency divided signal; low-pass filter for low-pass-filtering the phase difference; voltage-controlled oscillator for oscillating a frequency in response to the output signal of said low-pass filter and outputting the clock signal having the oscillated frequency; 1/N frequency divider for dividing the switching signal by N and outputting the divided signal as the frequency divided signal; and envelope detector for detecting an envelope of the filtered amplitude-modulated pilot signal and outputting the detected envelope as the pilot signal, wherein the frequency of the pilot signal has information regarding the discrimination of a broadcasting state.

To achieve the second object, an apparatus for detecting a pilot signal includes: a switched capacitor bandpass filter for receiving a composite signal of an audio signal and an amplitude-modulated pilot signal, filtering the amplitude-modulated pilot signal in response to a clock signal and outputting the filtered amplitude-modulated pilot signal; a level comparator for comparing the level of said filtered amplitude-modulated pilot signal with a predetermined level and outputting the compared result; a counter for counting pulses of a reference clock signal, having an arbitrary frequency, in response to the compared result and outputting the counted value; a phase detector for detecting a phase difference between the filtered amplitude-modulated pilot signal and an oscillating signal divided into a first predetermined ratio N; a low pass filter for low-pass-filtering the phase difference detected by the phase detector and outputting the filtered signal as an oscillation control voltage; a voltage controlled oscillator for adjusting a free-running frequency in response to the counted value and outputting the oscillating signal, the oscillating signal having frequency oscillated in response to the oscillation control signal; a divider for dividing the oscillating signal into said first and second predetermined ratios N and M and outputting the signal divided into the second predetermined ratio M as the clock signal; and an envelope detector for detecting an envelope of the filter amplitude-modulated pilot signal and outputting the detected envelope as the pilot signal, wherein the frequency of the pilot signal has information regarding the discrimination of a broadcasting state.

To achieve the third object, a method for detecting a pilot signal including the steps of: determining whether or not the level of the band-pass-filtered amplitude-modulated pilot signal is greater than a predetermined reference level; counting the pulses of a reference clock signal if the level of the band-pass-filtered amplitude-modulated pilot signal is less than the predetermined reference level; adjusting a free-running frequency of a voltage controlled oscillator in response to the counted value; generating the clock signal using a phase-locked loop (PLL) which receives the band-pass-filtered amplitude-modulated pilot signal, the PLL having the voltage controlled oscillator; and detecting an envelope of the band-pass-filtered amplitude-modulated pilot signal so as to output the pilot signal.

BRIEF DESCRIPTION OF THE DRAWINGS

The preferred embodiments of the present invention will now be described more specifically with reference to the attached drawings, wherein.

DETAILED DESCRIPTION OF THE INVENTION

Figure 1:
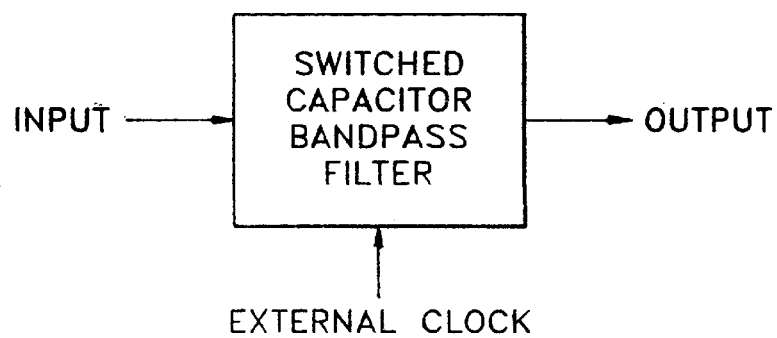
FIG. 1 is a block diagram of a conventional apparatus for detecting a pilot signal.
Figure 2:
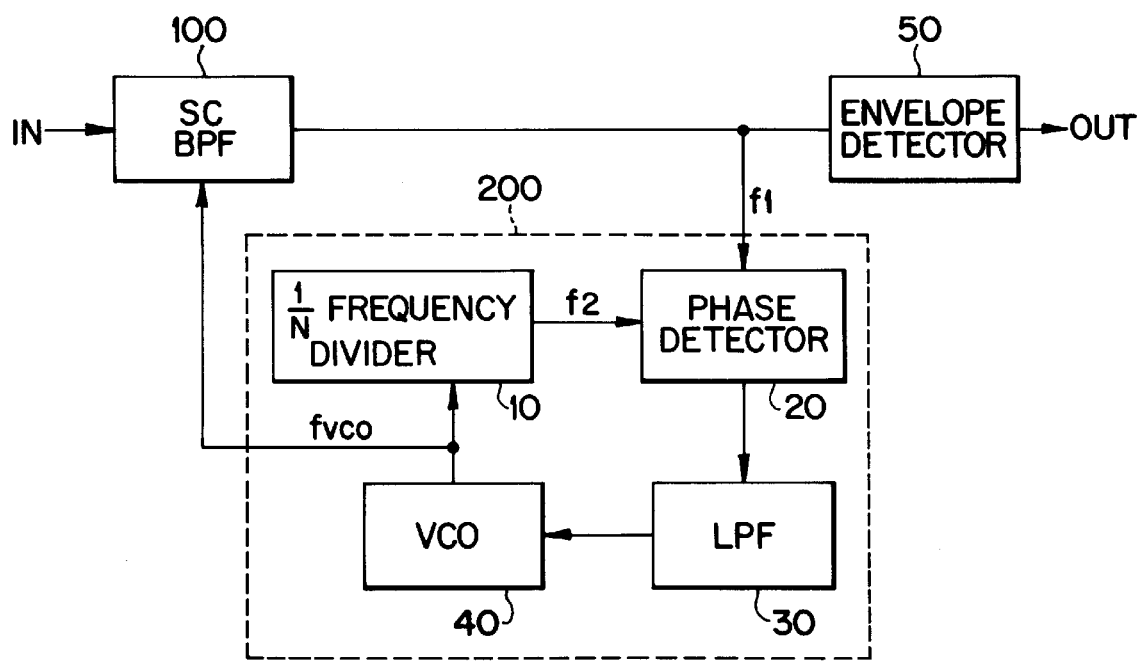
FIG. 2 is a block diagram of an apparatus for detecting a pilot signal according to the present invention.

As shown in FIG. 2, an apparatus for detecting a pilot signal according to the present invention includes a switched capacitor band-pass-filter (SC BPF) 100, a phase-locked loop (PLL) 200 made up of a 1/N frequency divider 10, a phase detector 20, a low-pass filter (LPF) 30, and a voltage-controlled oscillator (VCO) 40 and an envelope detector 50. In the PLL 200, the VCO 40 oscillates at a frequency in accordance with a signal output from the LPF 30. The output signal ($f_{vco}$) of the VCO 40 is used as a clock for the SC BPF 100.

The operation of the apparatus shown in FIG. 2 will now be described.

First, the SC BPF 100 detects an amplitude-modulated (AM) pilot signal from the composite signal composed of a 20–200 KHz audio signal and a 55.1 KHz pilot signal, via an input port IN shown in FIG. 2, and outputs the detected amplitude-modulated pilot signal to the phase detector 20 and the envelope detector 50. For reference, the frequency of a pilot carrier is 54.7 KHz in Germany and 55.1 KHz in Korea. The envelope detector 50 detects an envelope of the input amplitude-modulated pilot signal and outputs the detected envelope to a frequency detector (not shown) as a pilot signal via the output port OUT. The frequency detector detects the frequency of the envelope and outputs a signal corresponding to the detected frequency to an audio signal processor (not shown). The audio signal processor processes the audio signal in response to the signal output from the frequency detector. For example, in Germany, if the frequency of the envelope is 117 Hz, the audio signal processor determines if the audio signal is a stereo signal, and if the frequency is 274 Hz, the processor determines if the audio signal is a bilingual signal. However, in Korea, if the frequency is 150 Hz, the processor determines if the audio signal is a stereo signal, and if the frequency is 276 Hz, the processor determines if the audio signal is a bilingual signal.

Figure 3:
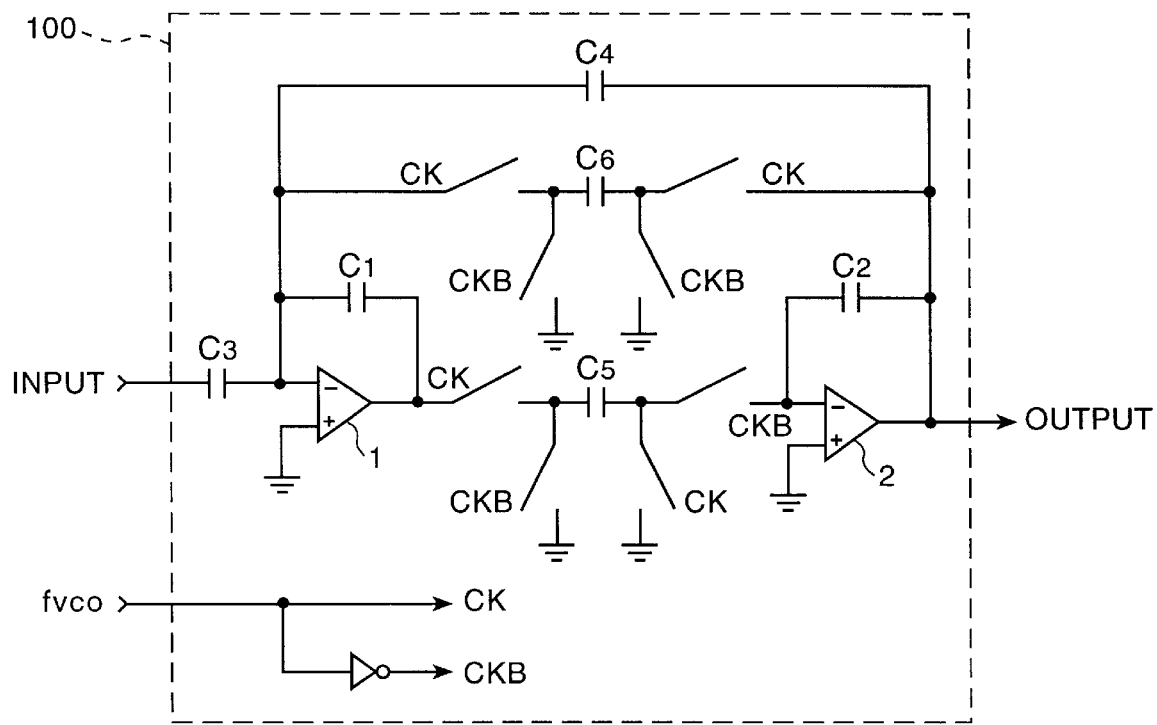
FIG. 3 is a detailed circuit diagram of the switched capacitor band pass filter (SC BPF) shown in FIG. 2.

As shown in FIG. 3, filter element 100 includes comparators 1 and 2, capacitors C1, C2, C3, C4, C5 and C6, and various switches controlled by the clock from the VCO 40. The clock signal includes a non-inverted signal CK and an inverted signal CKB.

The transfer function of the switched capacitor filter of FIG. 3 is given as the following equation (1).

$$H(s) = \frac{-s\left(\frac{C_3 C_5 f_{CK}}{C_1 C_2}\right)}{s^2 + s\left(\frac{C_4 C_5 f_{CK}}{C_1 C_2}\right) + \frac{C_5 C_6 f_{CK}^2}{C_1 C_2}} \quad (1)$$

From equation (1), the center frequency $f_c$ of the switched capacitor filter is obtained from the following equation 2.

$$f_c = \alpha f_{CK} \sqrt{\frac{C_5 C_6}{C_1 C_2}} \quad (2)$$

In the above equations, $\alpha$ is a constant of the filter element ($1/2\pi$ in the case of a secondary bandpass filter); $f_{CK}$ indicates the switch driving clock frequency of the filter; and the square root value indicates the ratio of capacitors of the filter.

As noted in equation (2), the pole of the filter element is determined by the ratio of the capacitors and the clock frequency $f_{CK}$. Given a constant capacitor ratio, the pole has a value proportional to the clock frequency $f_{CK}$. The ratio of capacitors is determined so that $f_{CK}$ becomes a predetermined number times the center frequency of the filter element. Here, it is established that a free-running frequency $F_f$ of the VCO 40 is the clock frequency $f_{CK}$. The output frequency $f_{vcc}$ of the VCO is divided by the (1/N) frequency divider 10 and fed back to phase detector 20, and when PLL 200 is locked, the output frequency $f_2$ of the (1/N) frequency divider 10 is the same as the frequency $f_1$ of a signal input to the phase detector 20. The frequency range of the PLL 200 is set as narrow as possible in order to minimize an inaccurate operation of the system.

The operation of the switched capacitor bandpass filter 100 of the apparatus according to the present invention will now be described below.

At the initial stage, that is, when no input is present, the VCO 40 is in a free-running state. The center frequency $f_c$ of the SC BPF 100 is determined using the free-running frequency $f_2$ of the VCO 40. When an input present within the usable frequency range of the PLL 200 is applied to the SC BPF 100, the input is filtered so that a signal $f_1$ is output to the PLL 200, and the VCO 40 of the PLL 200 oscillates at a frequency corresponding to the signal, that is, a signal $f_{vcc}$ having N times the frequency of the input signal. The signal $f_{vcc}$ is applied as the clock signal to the SC BPF 100 to reestablish the center frequency $f_c$ and fed back to the phase detector 20 so that the PLL 200 is locked. With the PLL 200 locked, the oscillation frequency of the VCO 40 follows the frequency of the input signal. At this time, center frequency $f_c$ of the SC BPF 100 is varied. If the input signal falls out of the locking range of the PLL 200, the PLL 200 is released and the VCO 40 enters the free-running state so that the center frequency $f_c$ of the SC BPF 100 is varied. If the input signal falls out of the locking range of the PLL 200, the PLL 200 is released and the VCO 40 enters the free-running state so that the center frequency $f_c$ returns to its initial state.

Figure 4:
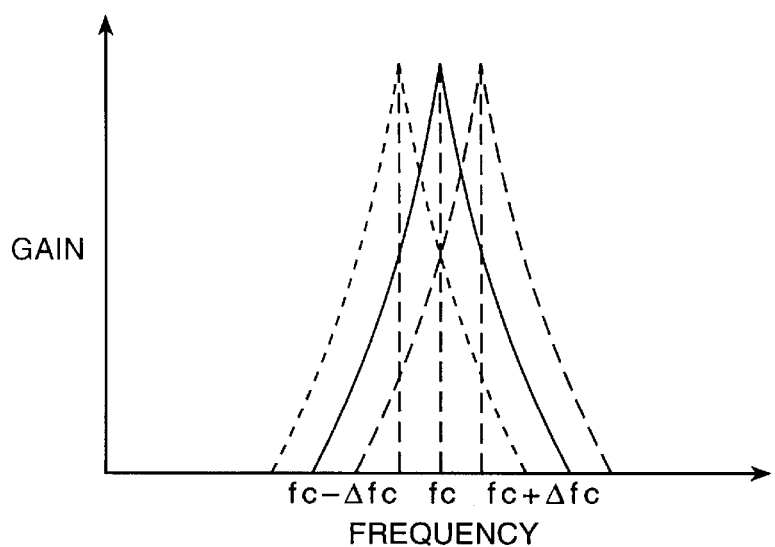
FIG. 4 is a graph showing the relation between frequency and gain in the switched capacitor bandpass filter of FIG. 2.

In the case in which the circuit of FIG. 2 is integrated, the free-running frequency $f_f$ of VCO 40 may be varied due to process parameters. In other words, at the initial stage, the center frequency of the filter element may be changed from the original target frequency $f_c$ to a frequency $f_c+\Delta f_c$ (or $f_c-\Delta f_c$). In this state, when an input is applied to the filter, the center frequency deviates from an established position so that the passed signal is attenuated and output to PLL 200. If the magnitude of the attenuated signal falls within the operating range of the phase detector 20, PLL 200 operates and is locked, the VCO 40 oscillates at a corresponding frequency, and the output signal $f_{vcc}$ of VCO 40 drives the SC BPF 100 so that its center frequency is changed from $f_c+\Delta f_c$ (or $f_c-\Delta f_c$) to $f_c$. In other words, even when the center frequency of the filter element is varied by process parameters, the whole system exhibits an accurate characteristic through self-regulation. FIG. 4 is a graph showing the characteristic of the bandpass filter of FIG. 2.

The SC BPF 100 of an apparatus according to the present invention can pass all input signals within the locking range of PLL 200 because its center frequency (pole) is adjusted by the PLL 200. The principle of the present invention explained above pertains to the case when only one composite signal (audio signal and pilot signal) is input. However, when many such composite signals, all of which fall within the PLL's locking range are sequentially input, only the earliest input signal (along the time axis) is output, regardless of their levels. In FIG. 4, the center frequency of the SC BPF 100 is fc in the initial state and when the signal at fc+Δfcis input, the pole of the SCF changes from fc to fc+Δfc. Then, since the center frequency of the SC BPF 100 is fixed at fc+Δfc when the fc+Δfc signal is present, the other input signals (i.e., fc–2Δfc and fc–Δfc), which are subsequently input, are removed and only the fc+Δfc signal is output from the SCF. That is, the SC BPF 100 of an apparatus according to the present invention has a characteristic in that only the signal which is input earliest among sequentially input signals is output.

As described above, the apparatus of the present invention uses a SC BPF 100 which does not need an external clock so that errors created due to process parameters can be removed through self-regulation. In the case in which several signals which fall within the frequency range of the PLL are sequentially input, the earliest input signal is detected and processed.

Figure 5:
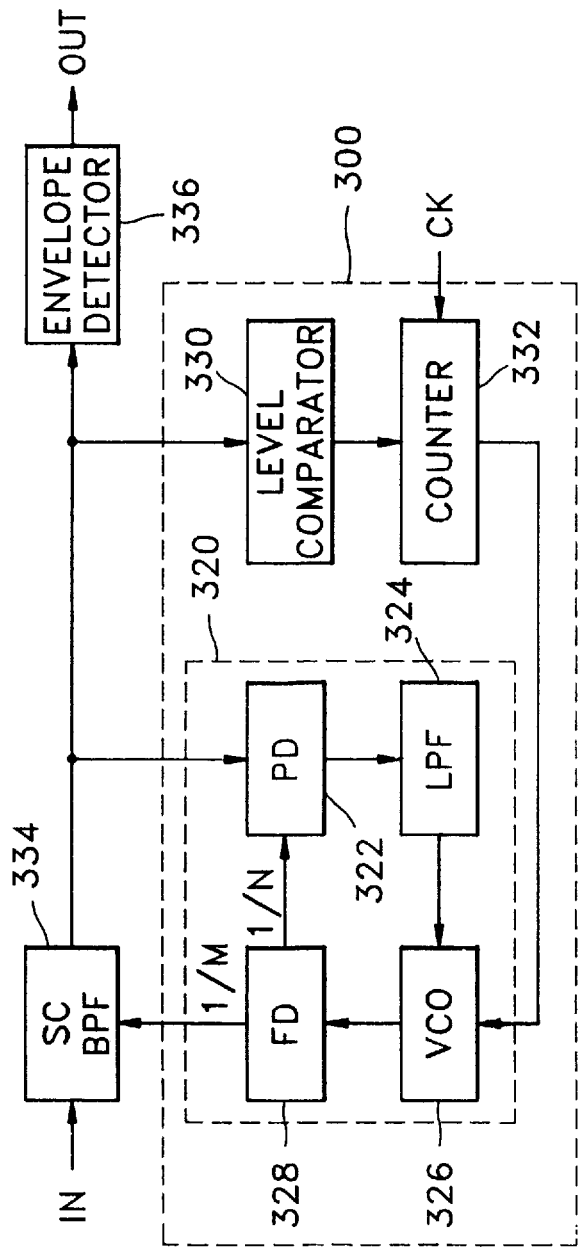
FIG. 5 is a block diagram of another embodiment of an apparatus for detecting a pilot signal according to the present invention.

In FIG. 5, a controller for a switched capacitor bandpass filter (SC BPF) 334 uses a clock signal to determine a center frequency of the switched capacitor bandpass filter 334 which filters an amplitude-modulated pilot signal from an input composite signal of an audio signal and amplitude-modulated signal input thereto via input port IN and outputs the filtered result. A level comparator 330 compares the level of the signal input from the SC BPF 334 with a predetermined level and outputs the result of the comparison. A counter 332 counts pulses of a reference clock signal CK having an arbitrary frequency in response to the result of the comparison and outputs the counted value. A phase detector (PD) 322 detects a phase difference between the signal output from the SC BPF 334 and an oscillating signal divided into a first predetermined ratio N and outputs the detected phase difference. A low pass filter (LPF) 324 low-pass-filters the input phase difference and outputs the filtered signal as an oscillation control voltage. A voltage controlled oscillator (VCO) 326 adjusts a free-running frequency in response to the counted value and outputs an oscillating signal having a frequency oscillated in response to the oscillation control voltage A frequency divider 328 divides the oscillating signal into predetermined first and second ratios N and M and outputs the signal divided into the predetermined second ratio M as a clock signal to the SC BPF 334. An envelope detector 336 performs the same function as the envelope detector 50 shown in FIG. 2.

According to the SC BPF 34 shown in FIG. 5, a passband is set within a narrow range to increase a frequency selectivity and the center frequency of the SC BPF 34 is determined by a clock signal generated by a phase-locked loop (PLL) 320. Here, the locking range of the PLL 320 should be set within a narrow range to prevent the PLL 320 from being affected by a noise component existing in a frequency band other than the frequency band occupied by a pilot signal. Also, the controller 300 shown in FIG. 5 should be designed to protect the free-running frequency of the VCO 326 from various processing variables.

Figure 6:
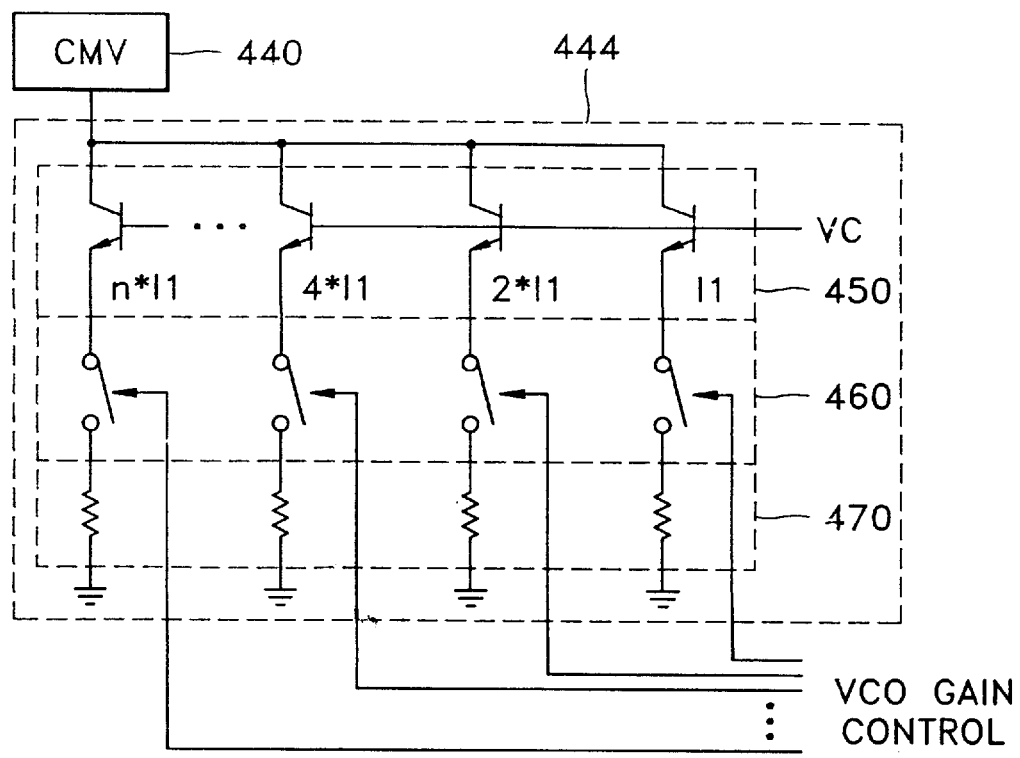
FIG. 6 is a circuit diagram of the voltage controlled oscillator (VCO) shown in FIG. 5 according to a preferred embodiment of the present invention.

FIG. 6 is a circuit diagram of the VCO 326 shown in FIG. 5 according to a preferred embodiment of the present invention, wherein the VCO 326 is comprised of an emitter coupled multivibrator (ECMV) 440 and a current source 444.

The current source 444 shown in FIG. 6 includes a predetermined number of transistors 450 each having a collector and an emitter which are connected between the ECMV 440 and a first node, respectively, and a base connected to a control voltage VC from the LPF 324. A predetermined number of resistors 470 which are connected between a second node and ground, respectively, and a predetermined number of switches 460 which are connected between the first node and the second node and are switched in response to the counted value.

The VCO 326 of the PLL 320 determines a free running frequency of the PLL and simultaneously determines the center frequency of the SC BPF 334 in a free-running state. The VCO 326 is designed as shown in FIG. 5 to independently adjust a gain in accordance with the counted value output from the counter 332.

The level comparator 330 shown in FIG. 5 receives a signal output from the SC BPF 334 and determines whether or not the level of the input signal is above a predetermined reference level. Here, it is assumed that a "high" level signal is output if the level of the input signal is above a predetermined reference level and a "low" level signal is output if the level of the input signal is below a predetermined reference level.

The counter 332 receives a signal output from the level comparator 330 and counts a reference clock signal CK having an arbitrary frequency if the low level signal is output from the level comparator 330. However, if a high level signal is output from the level comparator 330, the counting operation is terminated. Here, the number of bits of the counter 332 is determined according to the gain adjustment range and adjustment resolution of the VCO 326. Since it takes a long time to detect the pilot signal if the frequency of the reference clock signal CK is low, the frequency of the reference clock is set in consideration of a detection rate of the pilot signal. The counter 332 counts from a minimum value to a maximum value. When a new reference clock signal is input after reaching the maximum value, the counter 332 is reset to the minimum value and then starts the counting operation again.

In case attenuation occurs in the SC BPF 334 because the pilot signal exists outside of the locking range of the PLL 320 whether the pilot signal is input or not, the level of the signal output from the SC BPF 334 becomes less than the reference level. That is, the low level signal is output from the level comparator 330, so that the counter 332 performs the counting operation.

On the other hand, the PLL 320 changes the free-running frequency of the VCO 326, that is, the free-running frequency of the PLL 320, by using the counted value. Here, the change in the free-running frequency of the PLL 320 means a change in the locking range thereof. Thus, while the output of the level comparator 330 is a "low" level, the locking range of the PLL 30 is sequentially shifted within a range in which the gain of the VCO 326 can be adjusted. As described above, when the pilot signal is within the locking range of the PLL 320 while the locking range of the PLL 320 is shifted, the PLL is immediately locked and the shifting of the locking range of the PLL 20 is terminated.

Here, if the transmission of the amplitude-modulated pilot signal is terminated, the output of the level comparator 330 toggles low to restart the counting operation, and the PLL 320 shifts the locking range.

However, if the amplitude-modulated pilot signal is within the locking range of the PLL 320, the PLL 320 immediately becomes locked, so that the level of the output signal of the SC BPF 334 is higher than the reference level. Accordingly, the output signal of the level comparator 330 is toggled high, so that the counting operation of the counter 332 is terminated. That is, the locking state of the PLL 320 is fixed and the PLL 320 maintains the locking state until the filtered amplitude-modulated pilot signal is no longer input thereto.

As described above, according to the apparatus and method therefor for detecting a pilot signal, the center frequency of the switched capacitor band pass filter having a narrow passband is controlled precisely without an external device, so than a SC BPF having high selectivity can be obtained without external adjustment. Therefore, since an external device for the above function is not required compared with a conventional filter controller, the manufacturing cost and the number of pins in an integrated circuit can both be reduced.

What is claimed is:

1. An apparatus for detecting a pilot signal comprising:
   a switched capacitor band pass filter for receiving a composite signal made of an audio signal and an amplitude-modulated pilot signal, filtering the amplitude-modulated pilot signal in response to a clock signal and outputting the filtered amplitude-modulated pilot signal;
   a phase detector for detecting a phase difference between the filtered amplitude-modulated pilot signal and a frequency divided signal;
   a low-pass filter for low-pass-filtering the phase difference;
   a voltage-controlled oscillator for outputting the clock signal having the frequency determined by the output signal of said low-pass filter;
   a (1/N) frequency divider for (1/N) dividing the clock signal and outputting a (1/N) divided signal as the frequency divided signal; and
   an envelope detector for detecting an envelope of the filtered amplitude-modulated pilot signal and outputting the detected envelope as the pilot signal, wherein the frequency of the pilot signal has information used to discriminate a broadcasting state.

2. An apparatus for detecting a pilot signal comprising:
   a switched capacitor band pass filter for receiving a composite signal of an audio signal and an amplitude-modulated pilot signal, filtering the amplitude-modulated pilot signal in response to a clock signal and outputting the filtered amplitude-modulated pilot signal;
   a level comparator for comparing the level of said filtered amplitude-modulated pilot signal with a predetermined level and outputting the result of the comparison;
   a counter for counting pulses of a reference clock signal, having an arbitrary frequency, in response to the result of the comparison and outputting the counted value;
   a phase detector for detecting a phase difference between said filtered amplitude-modulated pilot signal and an oscillating signal divided into a first predetermined ratio N;
   a low pass filter for low-pass-filtering the phase difference detected by said phase detector and outputting the filtered signal as an oscillation control voltage;
   a voltage controlled oscillator for adjusting a free-running frequency in response to the counted value and outputting an oscillating signal, the oscillating signal having a frequency determined by the oscillation control voltage;
   a divider for dividing the oscillating signal into said first predetermined ratio N and a second predetermined ratio M and outputting the signal divided into the second predetermined ratio as said clock signal; and
   an envelope detector for detecting an envelope of the filtered amplitude-modulated pilot signal and outputting the detected envelope as the pilot signal, wherein the frequency of the pilot signal has information used to discriminate a broadcasting state.

3. An apparatus for detecting a pilot signal as claimed in claim 2, wherein the frequency of the reference clock signal is determined in accordance with a pilot signal detection rate.

4. An apparatus for detecting a pilot signal as claimed in claim 2, wherein said voltage control oscillator comprises:
   a current source having a predetermined number of transistors including a collector and an emitter which are connected between a current receiving means and a first node, respectively, and a base connected to the oscillation control voltage,
   a predetermined number of resistors which are serially connected between a second node and ground, and
   a predetermined number of switches which are connected between said first and second nodes and switched in response to the counted value.

5. A method for detecting a pilot signal, said method comprising the steps of:
   determining whether or not the level of a band-pass-filtered amplitude-modulated pilot signal is less than a predetermined reference level;
   counting pulses of a reference clock signal if the level of the band-pass-filtered amplitude-modulated pilot signal is less than the predetermined reference level;
   adjusting a free-running frequency of a voltage controlled oscillator in response to the counted value;
   generating a clock signal using a phase-locked loop (PLL) which receives the band-pass-filtered amplitude-modulated pilot signal, said PLL having the voltage controlled oscillator; and
   detecting an envelope of the band-pass-filtered amplitude-modulated pilot signal so as to output the pilot signal.

6. An apparatus for detecting a pilot signal as claimed in claim 1, wherein the frequency of said amplitude-modulated pilot signal is 55.1 kHz.

7. An apparatus for detecting a pilot signal as claimed in claim 1, wherein the frequency of said amplitude-modulated pilot signal is 54.7 kHz.

* * * * *

UNITED STATES PATENT AND TRADEMARK OFFICE
CERTIFICATE OF CORRECTION

PATENT NO. : 5,774,555
DATED : June 30, 1998
INVENTOR(S) : Lee, et. al.

It is certified that error appears in the above-identified patent and that said Letters Patent is hereby corrected as shown below:

Title page, insert --

Related U.S. Application Data

[62] Continuation-in-Part of Ser. No. 423,945, April 19, 1995--

In column 1, line 3, insert --This is a Continuation-in-Part of: National Appln. No. 08/423,945, filed April 19, 1995.--

Signed and Sealed this

Fourth Day of April, 2000

Attest:

Attesting Officer

Q. TODD DICKINSON

Director of Patents and Trademarks